United States Patent [19]

Lederman

[11] 4,409,547
[45] Oct. 11, 1983

[54] MERCURY-PROBE APPARATUS

[75] Inventor: Albert Lederman, New York, N.Y.

[73] Assignee: MSI Electronics Inc., Woodside, N.Y.

[21] Appl. No.: 244,745

[22] Filed: Mar. 17, 1981

[51] Int. Cl.³ .................. G01R 1/06; G01R 31/22; H01R 3/04

[52] U.S. Cl. .................. 324/158 P; 324/158 F; 339/118 R

[58] Field of Search .............. 324/158 F, 158 P, 72.5; 339/117 R, 117 P, 118 R

[56] References Cited

U.S. PATENT DOCUMENTS 4,101,830  7/1978  Greig .............................. 324/158 P

OTHER PUBLICATIONS

Koens, J. G.; "Micromanipulator. . ."; IBM Tech. Disclosure Bulletin; 15, No. 1; Jun. 1972; p. 344.

Primary Examiner—Ernest F. Karlsen

[57] ABSTRACT

The described apparatus includes a member of insulation containing a reservoir of mercury and a passage from a side of the reservoir to a contact aperture in a flat face of the member that engages a test wafer, the contact aperture being below the upper surface of the reservoir by a vertical distance limited to cause automatic return to the reservoir of mercury filling the passage when both ends of the passage are at atmospheric pressure. The length of the passage greatly exceeds said vertical distance.

13 Claims, 1 Drawing Figure

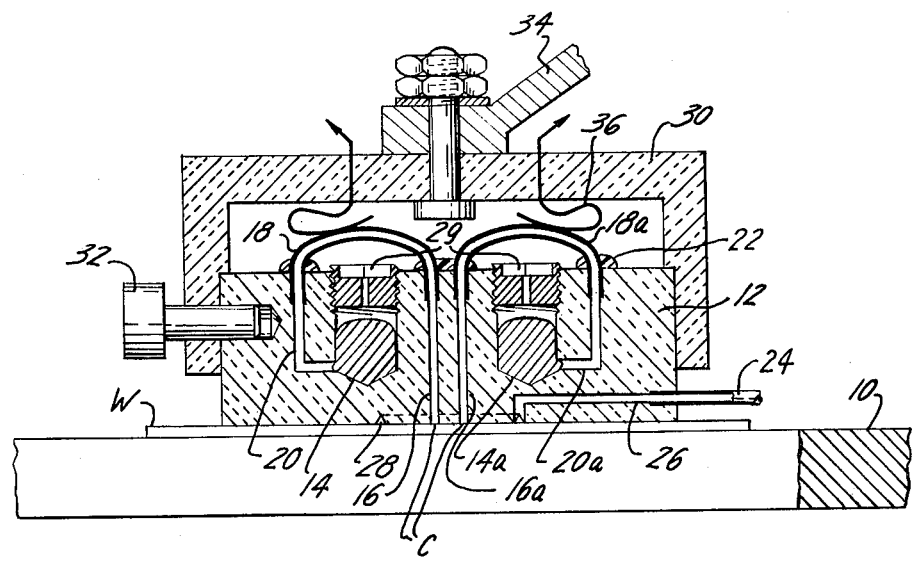

MERCURY-PROBE APPARATUS

The present invention relates to mercury probes, useful in making capacitance-voltage (C-V) tests of semiconductor wafers as well as other tests.

A mercury probe is shown in U.S. Pat. No. 4,101,830 issued July 18, 1978 to John H. Greig, assigned to the assignee hereof. In that patent, mercury is drawn to a contact aperture from a reservoir by developing vacuum in the interface between a test wafer of simiconductor and the member that provides the contact aperture.

Application Ser. No. 226,357 filed Jan. 19, 1981 by Carl Shulman and assigned to the assignee hereof discloses various improvements in mercury probes. Dirt particles may be picked up by the mercury at the contact area of a mercury probe. As one feature disclosed in the application of Carl Shulman, the dirt particles that are carried by the mercury returning to the reservoir can be caused to enter the mercury in the reservoir and float away from the opening of the passage into the reservoir. In this way, clean mercury is drawn to the contact aperture in succeeding test operations. The mercury is returned to the reservoir by gravity or by lower pneumatic pressure in the reservoir than at the contact aperture. That application also describes making multiple contacts to the test wafer.

A further mercury probe is disclosed in IBM Technical Disclosure Bulletin, Vol. 15 No. 1 by J. G. Koens dated June 1972. The mercury probe disclosed by Koens involves a reservoir of mercury disposed above a test wafer. The lower end of the reservoir is tapered to a small aperture. Pressure built up in the reservoir forces the mercury down to the aperture for contacting a test wafer. When the test is complete, the pressure in the reservoir is interrupted, and (according to Koens) capillary action causes the mercury to be retracted from the contact aperture. While that probe provides a test contact to the upper surface of the wafer, it is prone to hazardous escape of mercury both when pressure is built up in the reservoir and when the probe is subjected to a jolt.

An object of the present invention resides in providing a novel mercury probe that provides one or more of the advantageous features of the above-described mercury probes while ameliorating their disadvantages. More particularly, a further object resides in providing a novel mercury probe that automatically retracts the mercury from the wafer, while safeguarding the probe against escape of mercury. A further object of the invention resides in providing a compact mercury probe having provision for one or more mercury contacts on the upper surface of a test wafer, in which the mercury is restored to the reservoir automatically. A further object of the invention resides in the provision of a novel mercury probe useful for making test contact to a semi-conductor wafer in which the foregoing features are combined, incorporating the self-cleaning feature of the Shulman application.

An illustrative embodiment of the invention is detailed below and shown in the accompanying drawing. In that probe, a mercury reservoir is formed as a unit with the insulating member that provides the mercury contact aperture. Plural reservoirs and contact apertures can be incorporated in the same member, yet stray capacitance between the reservoirs and the passages can be held to acceptable low levels. For advancing the mercury to the contact aperture, vacuum is developed at the interface of the test wafer and the aperture member. This has the advantage discussed in the Greig patent that only when a test wafer is in place can mercury be drawn from the reservoir. This provides an automatic safeguard against escape of mercury. In common with the probe in the above-mentioned IBM bulletin, the mercury is self-restoring out of contact with the test wafer when the mercury-displacing pressure is interrupted. This is due to the location of the test contact aperture only a limited distance below the surface of the memory in the reservoir. However, the passage from the reserovir to the contact aperture is much longer than that distance. Therefore, if the probe is jolted when the passage is empty, the tendency of mercury to escape is largely if not wholly prevented. The passage opens into the reservoir from a side, making it easy for dirt particles to float away from the opening in the reservoir. That opening could be formed in the bottom of the reservoir, but for space limitations. Clean mercury enters the passage for the next test.

The nature of the invention as well as the foregoing and other objects, novel features and advantages will be best appreciated from the following detailed description of a presently preferred illustrative embodiment of its various combined features which is shown in the accompanying drawing.

IN THE DRAWING

The single FIGURE is an elevation, largely in cross-section, of an illustrative embodiment of the invention.

In the drawing, the wafer W of semiconductor such as silicon rests on support 10. The support may be of insulation or a conductor, but it is of metal in case it is to provide a connection from the lower surface of the mercury to the test circuit. A block 12 of electrical insulation such as a phenolic body rests on wafer W. Mercury passages extend to contact areas C at the test wafer from reservoirs 14 and 14a. The mercury passages include bores 16 and 16a, tubes 18 and 18a and passage segments 20 and 20a. Bores 16 and 16a are of the proper diameter to provide the desired size of contact areas C. The connections of arched tubes 18 and 18a to block 12 have seals 22 as of epoxy cement to avoid air leaks into the mercury passages. Of course, block 12 is free of fissures that would allow air to leak to the mercury passages. Tubes 18 and 18a provide a convenient means for making electrical connections to the mercury passages. For this purpose, these tubes may be of stainless steel or any other non-amalgam-forming metal. Passage segments 20 and 20a can be made by forming horizontal bores from the outer surfaces of block 12 to the respective reservoirs, forming vertical bores from the top of the block to intersect the horizontal bores, and then plugging the portions of the horizontal bores from the outer surfaces of block 12 to the intersecting vertical bores. Threaded plugs 29 cover the mercury in the reservoirs. These plugs have vent passages that are too fine for the mercury to escape.

A vacuum line 24 communicates through a passage 26 to a circular groove in the lower face of block 12 surrounding contact areas C.

A cover 30 of electrical insulation has a snug fit on block 12, and is secured in place in any convenient manner as by means of a pin 32. Cover 30 and block 12 form a head that is carried by an arm 34, to be moved as a unit from a remote position to wafer W with contact areas C at selected locations. For example, a suitable arm is shown in U.S. Pat. No. 4,101,830. Cover 30 has a pair of spring contacts 36 that make test-circuit connection to tubes 18 and 18a.

In operation, the apparatus is assembled as shown with a test wafer in position, and vacuum is "turned on". This has the effect of developing vacuum in the interface between block 12 and the test wafer, holding the wafer in a secure position during the test. Additionally, the vacuum draws mercury from the reservoirs to contact areas C. (Fine crevices that criss-cross the face of block 12 provide air passages between groove 28 and bores 16 and 16a.) Tests may be performed using each contact C and support 10, or contacts C can form a two-terminal test circuit to the wafer. Two additional reservoirs and passages like those shown can provide additional test contacts, as may be required in the well-known four-point test.

When the test has been completed, the vacuum is turned off. Air enters the interface between block 12 and the wafer, restoring atmospheric pressure to contact areas C. The mercury is then retracted into the reservoir. The passage empties as a result of the surface tension of the mercury. This effect occurs despite the hydraulic head of the mercury above the contact aperture. The maximum height of this head for self-retraction to occur is limited primarily by the cross-section of the passage.

The surface tension at the exit of the passage (the contact aperture) provides a force tending to retract the mercury toward the reservoir. Gravity provides an opposite force. The hydraulic head matches that surface tension when the height h of the mercury from the contact aperture to the top surface of the mercury in the reservoir:

$$h = (2 S / \rho g r)$$

where
$\rho = 13.5$, the density of mercury;
$S = 487$ dynes/cm, the surface tension of mercury;
$g = 480$ cm/sec$^2$, acceleration of gravity; and
$r =$ the radius of the aperture.

In an example, where the radius of the bore at the aperture is 0.0165 inch or 0.042 cm, the height h is about 0.7 inch. This is reduced slightly if the reverse-acting surface tension in the reservoir (whose diameter is finite) is taken into account. Accordingly, for a passage having a diameter of 0.033 inch at the contact aperture, the maximum height of the mercury in the reservoir above the contact aperture should be somewhat less than 0.7 inch in order for mercury filling the passage to be drawn into the reservoir when the air pressure at both ends is equalized. If there were an enlargement in the passage partway along its length, the surface tension of the mercury when retracted to that point would be reduced, affecting the return of the mercury to the reservoir. For this reason it is desirable for the passage to be free of such enlargement at least at the lower-level portions of the passage. The illustrated passage having a uniform bore diameter avoids uncertainty in this respect.

Fine dust, lint or the like, might be picked up by the mercury at the wafer surface. Such dirt particles enter the reservoir as the mercury completes its return to the reservoir. This fine dirt tends to rise to the surface of the mercury in the reservoir. In the next test operation, clean mercury enters the passage, an automatic process of self-cleaning of the mercury that is reused in successive tests. Dirt carried by the mercury to the contact area causes inaccurate and erratic test results. The passage entering the reservoir is horizontal so that the surface of the mercury at the inlet to the reservoir is more-or-less vertical when the passage has emptied. This factor promotes free rise of dirt particles away from the opening of the passage into the reservoir. As the mercury begins to return along the passages to the reservoir, it develops momentum which enhances the self-clearing of dirt upon completion of the return of the mercury into reservoir.

The described apparatus includes an extended passage from the reservoir to the contact area, especially a passage that incorporates an arched segment. That construction has a notable advantage over a like reservoir with a passage that extends directly downward from the reservoir to the contact aperture C. In the latter case, the downward-extending passage alone is of very limited length, since the overall height h of the passage and the reservoir is limited as discussed above. When the arm is being manipulated to move the head 12, 30 and when the apparatus is not in use so that the lower face of block 12 is unobstructed, an accidental jolt of the head would tend to force mercury to enter the passage and escape. The extended passage, especially one that includes an arch, greatly reduces the possibility of such escape of mercury.

The drawing is diagrammatic in some respects. For convenience the illustration shows the axis of the reservoir in the common plane of bore 16 and the vertical bore of passage segment 20. As a result, tube 18 is shown arching over cover 29 of the reservoir. In practice, the reservoir is located out of position below arched tube 18 so that cover 29 can be removed readily for refilling the reservoir with fresh mercury.

The sizes of the reservoirs and their proximity to each other can be varied with a view minimizing stray capacitances between them. Similarly, although bores 16 and 16a are fine so that there is only a slight amount of capacitance between the portions of mercury in those bores, the configuration of the mercury passages can be varied by design for minimizing the stray capacitance between them.

It has been noted above that a segment of the mercury passage entering the reservoir is horizontal. The rest of the passage resembles an inverted "J". As an alternative, the horizontal segment of the passage could be omitted, sacrificing its benefit. The mercury passage in this alternative would consist of a J-shaped passage with the short end of the "J" entering the reservoir downward and with the long end of the "J" extending to the contact area as in the drawing.

The illustrative embodiment of the invention achieves several objectives. A compact mercury probe is provided having the mercury reservoir(s) in the contact-aperture block above the test wafer. The mercury returns to the reservoir automatically after having been displaced into contact with the wafer. The returning mercury tends to be self-clearing of dirt when it returns to the reservoir after each test so that clean mercury is displaced to the contact aperture in the next test. The possibility of escape of mercury in case the apparatus is jolted is severely inhibited.

It is apparent that the foregoing exemplary apparatus is subject to modification by those skilled in the art, and that some of the novel features can be used without retaining the benefit of the others. Consequently, the invention should be construed broadly in accordance with its true spirit and scope.

What is claimed is:

1. Apparatus for testing semiconductor wafers, including a support for a test wafer and a mercury probe movable into test position overlying the test wafer, said mercury probe comprising a reservoir of mercury and means defining a mercury passage having one end that opens into a submerged portion of said reservoir, the opposite end of the passage being formed in insulation and constituting a contact aperture, means for establishing a pressure difference between the reservoir and the contact aperture to fill the passage with mercury, said contact aperture being below the upper surface of the mercury in the reservoir by a vertial distance, said vertical distance and the cross-section of the passage being so limited that, when said pressure difference is eliminated, surface tension of the mercury causes the mercury in the passage to be emptied automatically into the reservoir, said passage including means for inhibiting escape of mercury from the reservoir via said passage in case the probe is jolted while the contact aperture is unobstructed.

2. Apparatus as in claimm 1, wherein said passage is shaped at least in part as an inverted "J" comprising an arched portion connecting a short leg and a longer leg, the latter terminating in said end of the passage that constitutes said contact aperture.

3. Apparatus as in claim 2 wherein said arched portion extends above the level of the mercury in the reservoir.

4. Apparatus as in claim 1 wherein said pressure difference establishing means comprises means for developing vacuum at said contact aperture.

5. Apparatus as in claim 1, such apparatus being subject to dirt particles being carried to the reservoir by the mercury returning from the contact aperture, said one end of the mercury passage being arranged to provide a free path for dirt that may be carried with returning mercury to enter into the reservoir and float therein.

6. Apparatus as in claim 1, wherein said probe comprises a unitary assembly of plural reservoirs having respective elongated passages terminating at respective apertures, all as aforesaid.

7. Apparatus as in claim 4, wherein said reservoir has a cover comprising a fine vent passage.

8. Apparatus as in claim 1, wherein said mercury probe comprises a member of insulation having a flat wafer-engaging face in which said contact aperture is formed and said member having a cavity therein constituting said reservoir, said member having a groove in said wafer-engaging face surrounding said contact aperture and having air passage means extending from the groove through the member to a vacuum line.

9. Apparatus as in claim 1, wherein said mercury passage defining means includes an arched non-amalgam-forming metal tube and means forming an electrical test connection to said metal tube and thereby providing an electrical test connection to said contact aperture when the passage is filled with mercury.

10. Apparatus as in claim 8, wherein said member of insulation comprises plural mercury reservoirs and plural contact apertures all as aforesaid, wherein said groove surrounds said plural contact apertures, and wherein said passage means for each said reservoir is shaped in part as an inverted "J" comprising an arched portion connecting a relatively long leg extending to a respective contact aperture and a relatively short leg, said passage means of each reservoir including a segment extending from said short leg and opening into a submerged portion of the reservoir.

11. Apparatus as in claim 1, wherein said probe comprises a member of insulation having a cavity therein forming said reservoir and providing said insulation at the contact aperture, and wherein said passage is shaped at least in part as an inverted "J" comprising an arched portion connecting a short leg and a longer leg, the lower end of said longer leg constituting said contact aperture, and said arched portion of the passage being defined by a tube of non-amalgam-forming metal extending above said member of insulation and providing electrical connection to the mercury at the contact aperture when the passage is filled with mercury.

12. Apparatus as in claim 1 wherein said mercury passage comprises an elongation of uniform bore diameter whose length exceeds substantially the vertical distance between the reservoir and the contact aperture, said elongation constituting said means for inhibiting the escape of mercury.

13. Apparatus as in claim 1 wherein said mercury passage comprises an elongation whose length is substantially longer than said vertical distance between the upper surface of the mercury in the reservoir and the contact aperture, said elongation of the passage constituting said means for inhibiting the escape of mercury.

* * * * *